United States Patent
Morita et al.

(10) Patent No.: US 6,921,865 B2
(45) Date of Patent: Jul. 26, 2005

(54) SUPERCONDUCTOR CONNECTION STRUCTURE

(75) Inventors: Hiroshi Morita, Hitachi (JP); Kazuhide Tanaka, Hitachi (JP); Yasuo Suzuki, Takahagi (JP); Michiya Okada, Mito (JP)

(73) Assignee: Hitachi, Ltd., Tokyo (JP)

( * ) Notice: Subject to any disclaimer, the term of this patent is extended or adjusted under 35 U.S.C. 154(b) by 376 days.

(21) Appl. No.: 10/083,504

(22) Filed: Feb. 27, 2002

(65) Prior Publication Data

US 2003/0051901 A1 Mar. 20, 2003

(30) Foreign Application Priority Data

Jul. 10, 2001 (JP) ........................................ 2001-208675

(51) Int. Cl.[7] .............................................. H01B 12/00
(52) U.S. Cl. ..................... 174/125.1; 505/220; 505/230
(58) Field of Search ..................... 174/125.1; 505/220, 505/230, 231, 233, 234, 420, 430, 431, 433, 434; 257/661–663

(56) References Cited

U.S. PATENT DOCUMENTS 5,134,040 A * 7/1992 Benz et al. .................. 428/646
5,786,304 A * 7/1998 Kimura et al. ............... 505/234
6,429,174 B2 * 8/2002 Sengupta ..................... 505/234
6,514,557 B2 * 2/2003 Finnemore et al. ........... 427/62

FOREIGN PATENT DOCUMENTS

JP        2001102105        4/2001

OTHER PUBLICATIONS

Nature, vol. 410, Mar. 1, 2001, pp. 63–64.

* cited by examiner

*Primary Examiner*—Kamand Cuneo
*Assistant Examiner*—Jeremy Norris
(74) *Attorney, Agent, or Firm*—Crowell & Moring LLP

(57) ABSTRACT

Electrical connection of superconducting lines can be achieved by using a low-melting point metal, by mechanical contact of superconducting lines or by welding. According to these methods, however, critical current and critical magnetic field at the connection point are low, and stable connection in a superconducting state has been difficult. The present invention solves these problems and provides a structure and method for connecting superconducting lines. The present invention provides high-performance, high-stability connection of superconducting lines through magnesium diboride ($MgB_2$) powder arranged between superconducting lines.

12 Claims, 4 Drawing Sheets

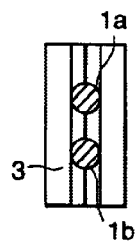
FIG. 1c
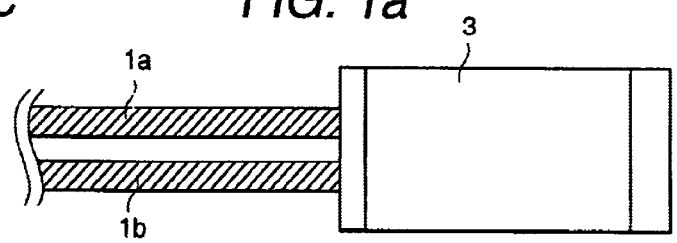
FIG. 1a
FIG. 1b
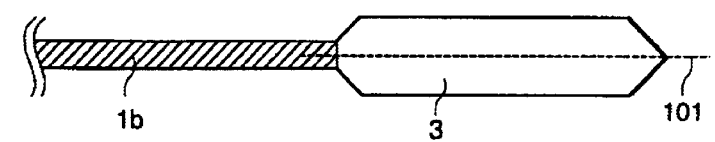
FIG. 2
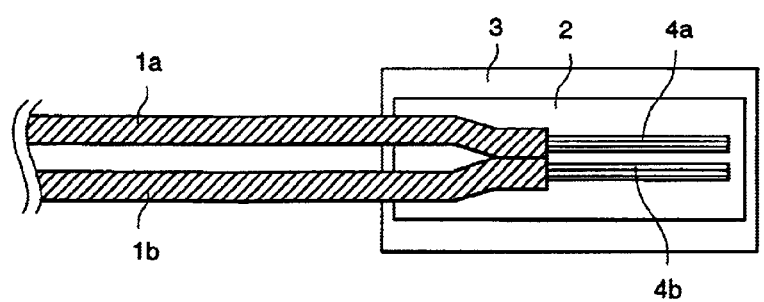

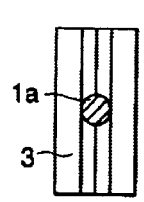
FIG. 5c
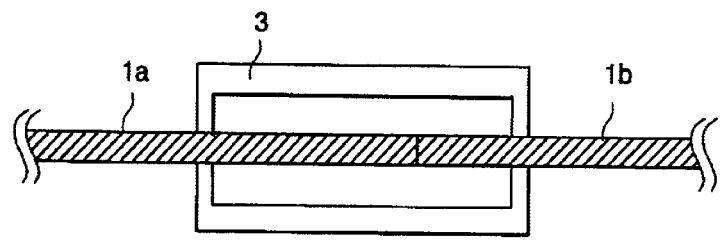
FIG. 5a
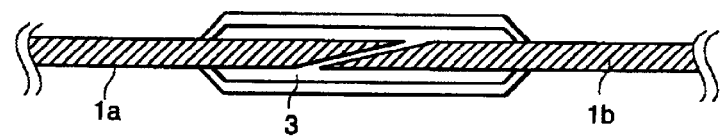
FIG. 5b
FIG. 6
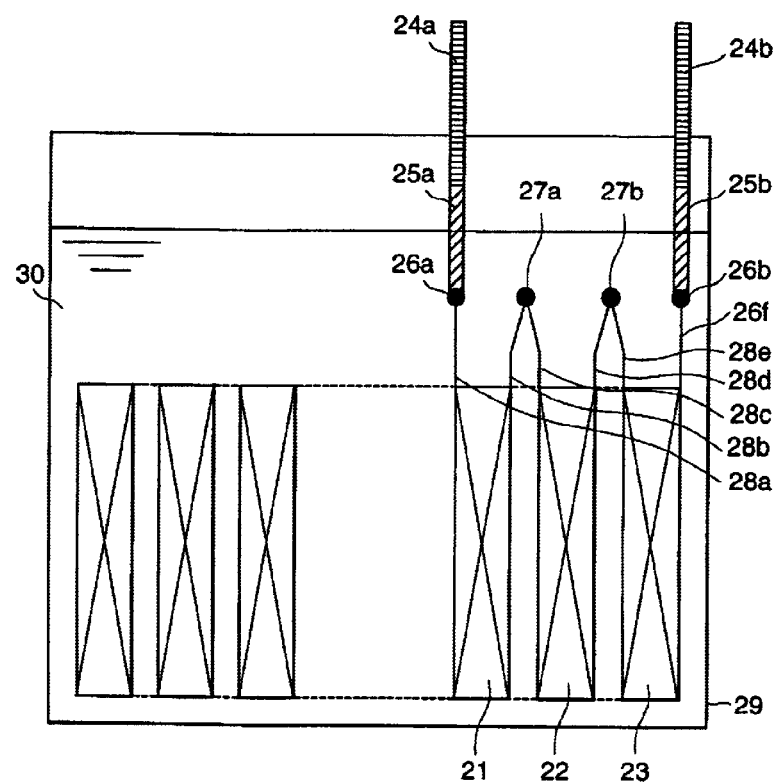

SUPERCONDUCTOR CONNECTION STRUCTURE

BACKGROUND OF THE INVENTION

1. Field of the Invention

The present invention relates to a superconducting line, superconducting line connection structure and production method thereof. To put it more specifically, the present invention applies to a superconducting magnet system, current lead, power transmission cable, nuclear magnetic resonance analyzer, magnetic resonance diagnostic apparatus for medical use, superconducting power storage apparatus, magnetic separation apparatus, single crystal pulling apparatus in magnetic field, refrigerator cooling superconducting magnet apparatus, superconducting energy storage, superconducting generator and magnet for nuclear fusion reactor.

2. Description of Prior Art

A superconducting magnet apparatus, superconducting power cable or the like may require electrical connection of two or more superconducting lines. For example, electric resistance at a connection point must be minimized in the permanent current operated superconducting magnet apparatus, thereby reducing the damping factor of magnetic field produced by a magnet. Further, refrigerant consumption is increased by heat generated at the connection point in a superconducting power cable carrying a large current. This requires electric resistance to be reduced at the connection. A method for electrical connection of two or more superconducting lines is found in Japanese Application Patent Laid-Open Publication No. 2001-102105 which discloses a method for solidifying the superconducting line subsequent to soaking it in the melt of metal or alloy.

SUMMARY OF THE INVENTION

As shown in the description of the prior art, a superconducting line can be electrically connected by a method for solidifying the superconducting line subsequent to soaking it in the melt of metal or alloy. This method, however, involves complicated steps and a complex structure. Further, critical magnetic field of the metal or alloy is 1 T or less, and the connection point cannot be laid out in high magnetic field. Moreover, there remains a problem of the superconducting line being denatured due to metal melt at about 500 degrees Celsius, resulting in deteriorated superconducting characteristics.

An object of the present invention is to provide a superconducting line connection structure capable of solving these problems.

As reported in Nature 410, 63–64 (2001) published recently, magnesium diboride ($MgB_2$) has been found out to be superconducting.

(1) Critical Temperature $MgB_2$ has a critical temperature of 39K. This is the maximum value in prior art metal-based superconducting materials. When this material is used to constitute a superconducting line connection point, stability margin is increased due to high critical temperature. This allows connection of a superconducting line where a quick transfer to normal conduction is provided, namely, quenching phenomenon is hard to occur. Further, liquid hydrogen and gas helium can be used as a refrigerant because of high critical temperature.

(2) Critical Magnetic Field

The critical magnetic field at 0 T is about 18 T. It does not exceed 10 T when liquid helium is at 4.2K. According to the prior art connection technique in the superconducting magnet, the critical magnetic field of the connection point may be reduced, and this was accompanied by the following restrictions: A connection point had to be installed at a small space away from the superconducting magnet or a magnetic shield had to be provided outside the connection point. However, when the connection point of a superconducting line is configured through the use of the material according to the present invention, the aforementioned restrictions are removed, with the result that a higher degree of freedom is assigned to the configuration of a connection point.

(3) Bonding Property

A tentative production of a powder-in-tube wire using $MgB_2$ without heat treatment is reported in recent years. This is realized by excellent bonding property among $MgB_2$ particles. This feature is not found in other superconducting materials.

Further, production method of using no heat treatment for a wire is different from that of oxide superconducting line and other superconducting lines.

In view of the excellent feature of $MgB_2$ as a superconducting material as described above, the present inventors have been studying how to apply $MgB_2$ to the connection point of a superconducting line. To solve the aforementioned problems, the present inventors have used the following means:

The superconducting line connection structure according to claim 1 is based on the electrical connection structure between two or more superconducting lines characterized in that superconducting powder including magnesium diboride is provided between the aforementioned superconducting lines. Use of this structure provides a simple structure where the aforementioned superconducting powder alone is placed between the aforementioned superconducting lines, with the result that the superconducting line connection structure is simplified.

The superconducting line connection structure according to claim 2 is based on the superconducting line connection structure described in claim 1, the mixture of superconducting powder and metal powder is added between the aforementioned superconducting lines as an alternative to the aforementioned superconducting powder, wherein metallic powder or alloy powder having a melting point lower than the superconducting powder is added to the mixture of superconducting powder and metal powder. Use of this structure allows a plastic metal to improve the bonding property between particles of the aforementioned superconducting powder, thereby ensuring conduction of a large current.

The superconducting line connection structure according to claim 3 is based on the superconducting line connection structure described in claim 1 or 2 and characterized in that the average particle size of the aforementioned superconducting powder is 20 microns or less. Use of this structure improves the bonding property between particles of the aforementioned superconducting powder, thereby ensuring conduction of a large current.

The superconducting line connection structure according to claim 4 is based on the superconducting line connection structure described in claim 1 or 2, and characterized in that the aforementioned superconducting line and the aforementioned mixture of superconducting powder and metal powder are enclosed in a coating material made of a pure metal of gold, silver, copper, platinum, palladium, aluminum, niobium, lead, tin, magnesium, indium, tungsten, cobalt, nickel, iron, tantalum or chromium, or an alloy containing at least one of the aforementioned metals. Use of this structure ensures that the aforementioned superconducting powder or the aforementioned mixture of superconducting powder and metal powder is not dissipated or lost, whereby mechanically stable connections are provided.

The superconducting line connection structure according to claim 5 is based on the superconducting line connection structure described in claim 1 or 2, and characterized in that a superconducting filament enclosed in the aforementioned superconducting line is directly in contact with the aforementioned superconducting powder at least on some portion of the contact surface between the aforementioned superconducting line and the aforementioned superconducting powder. Use of this structure provides a connection structure where no electric resistance occurs between the aforementioned superconducting lines.

The superconducting line connection structure according to claim 6 is based on the superconducting line connection structure described in claim 1 or 2, and characterized in that the density of the aforementioned superconducting powder is 50% or more of theoretical density. Use of this structure improves the bonding property between particles of the aforementioned superconducting powder, thereby ensuring conduction of a large current.

The method for producing a superconducting line connection structure according to claim 7 is based on the method for producing a superconducting line connection structure described in claim 1 or 2, and characterized in that heat treatment of the aforementioned superconducting line connection structure has never been provided. Use of this method ensures a connection structure without performances of the aforementioned superconducting line being deteriorated by heat treatment.

The method for producing a superconducting line connection structure according to claim 8 is based on the method for producing a superconducting line connection structure described in claim 1 or 2, and characterized in that heating is performed to reach the temperature equal to or higher than the range where a part of any one of the aforementioned superconducting line, the aforementioned superconducting powder and the aforementioned pure metal powder or the aforementioned alloy powder included in the aforementioned mixture of superconducting powder and metal powder melts down. Use of this method improves the bonding property between the aforementioned superconducting line, the aforementioned superconducting powder particles and the aforementioned mixture of superconducting powder, thereby ensuring conduction of a large current.

The method for producing a superconducting line connection structure according to claim 9 is based on the method for producing a superconducting line connection structure described in claim 4, and comprises; (1) a first step of enclosing the aforementioned superconducting line and the aforementioned superconducting powder in a coating material made of a pure metal of gold, silver, copper, platinum, palladium, aluminum, niobium, lead, tin, magnesium, indium, tungsten, cobalt, nickel, iron, tantalum or chromium, or an alloy containing at least one of the aforementioned metals, and (2) a second step of deforming the portion produced in the first step by applying a pressure of 1 ton/cm$^2$ or more thereto. Use of this method improves the bonding property the aforementioned superconducting line, the aforementioned superconducting powder particles and the particles of aforementioned mixture of superconducting powder and metal powder, thereby ensuring conduction of a large current.

The superconducting line connection structure according to claim 10 is based on the superconducting line connection structure according to claim 1 or 2, and characterized in that at least one of the aforementioned multiple superconducting lines to be connected or the aforementioned multiple superconducting stranded wires has the critical temperature equal to or higher than that of magnesium diboride. Use of this structure, for example, allows connection between oxide superconducting lines, between $MgB_2$-based superconducting lines, between oxide superconducting line and metal-based superconducting line, between oxide superconducting line and $MgB_2$-based superconducting line, and between $MgB_2$-based superconducting line and metal-based superconducting line.

The superconducting line connection structure according to claim 11 is based on the superconducting line connection structure described in claim 1 or 2, and characterized in that the superconducting line to be connected is a superconducting stranded wire formed by twisting multiple superconducting lines. This superconducting line connection structure allows power consumption to be reduced due to low electric resistance even if the connection point is located in the magnetic field. The apparatus using this connection structure does not require the connection point to be located within range of low magnetic field. So the entire magnet can be designed in a compact configuration, and the structure of connection points can be simplified. The superconducting line connection structure according to claim 12 is based on the superconducting line connection structure according to claim 11, and characterized in that the aforementioned superconducting stranded wire is a superconducting stranded wire inside a cable-in-conduit type forcibly cooled superconductor. This superconducting line connection structure allows power consumption to be reduced due to low electric resistance even if the connection point is located in the magnetic field. The apparatus using this connection structure does not require the connection point to be located within range of low magnetic field. So the entire magnet can be designed in a compact configuration, and the structure of connection points can be simplified.

The superconducting magnet apparatus according to claim 8 is characterized by comprising a superconducting line connection structure according to claim 1 or 2.

The superconducting magnet apparatus according to claim 12 is characterized by comprising a superconducting line connection method manufactured in the method for producing a superconducting line connection structure according to claim 7. This superconducting magnet apparatus allows a large current to be sent to a connection point, and permits power consumption to be reduced due to low electric resistance even if the connection point is located in the magnetic field. The apparatus using this connection structure does not require the connection point to be located within range of low magnetic field. So the entire magnet can be designed in a compact configuration, and the structure of connection points can be simplified.

BRIEF DESCRIPTION OF THE DRAWINGS

FIG. 1a is a front view of a superconducting line with a connection part thereof representing embodiment 1;

FIG. 1b is a plane view of FIG. 1a;

FIG. 1c is a side view of FIG. 1a;

FIG. 2 is a cross sectional view of FIG. 1b taken along a line 101 in FIG. 1b;

FIG. 4b is a plane view of FIG. 4a;

FIG. 4c is a side view of FIG. 4a;

FIG. 5a is a vertical cross section of the superconducting line with the connecting portion thereof representing embodiment 7;

FIG. 5b is a horizontal sectional view of FIG. 5a;

FIG. 5c is a side view of FIG. 5a;

FIG. 6 is a conceptual view representing embodiment 8;

Figure 3:
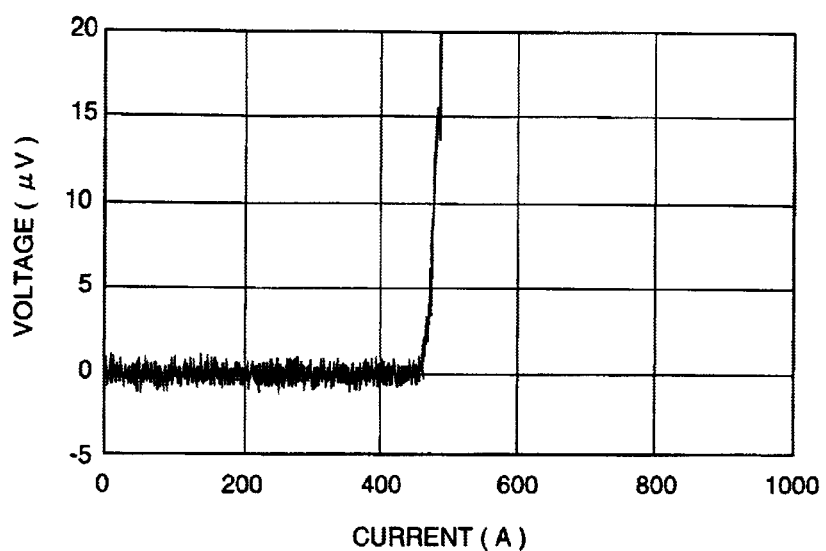
FIG. 3 is a diagram representing the current/voltage characteristics of embodiment 1.

DESCRIPTION OF REFERENCE NUMERALS 1a, 1b . . . superconducting line to be connected, 2 . . . $MgB_2$ powder, 3 . . . coating material of connection point, 4 . . . superconducting filament, 1a, 11b . . . superconducting stranded wire, 12a, 12b . . . superconducting filament, 13a, 13b . . . conduit, 14 . . . sleeve, 15 . . . refrigerant discharge port, 21 . . . first layer superconducting coil, 22 . . . second layer superconducting coil, 23 . . . third layer superconducting coil, 24a, 24b . . . gas cooled current lead, 25a, 25b, 54a, 54b . . . Bus bar, 26a, 26b . . . bus bar/superconducting line connection point, 27a, 27b . . . superconducting line/ superconducting line connection point, 28a . . . lead inside the first layer coil, 28b . . . lead outside the first layer coil, 28c lead inside the second layer coil, 28d . . . lead outside the second layer coil, 28e . . . lead inside the third layer coil, 28f . . . lead outside the third layer coil, 29 . . . cryostat, 30 . . . liquid helium, 51a, 51b . . . forcibly cooled superconducting coil, 52 . . . connection point, 53a, 53b . . . bus bar connection point, 55 . . . power supply for coil excitation, 56 . . . super-critical pressure helium generating apparatus, 57 . . . super-critical pressure helium discharge port in super-critical pressure helium generating apparatus, 58 . . . super-critical pressure helium suction port in super-critical pressure helium generating apparatus, 101 . . . cutting plane along cross sectional view.

DESCRIPTION OF THE PREFERRED EMBODIMENTS

Embodiment 1

FIGS. 1a to 1c are external views in the first embodiment of a superconducting line connection (hereinafter referred to as "connection point") according to the present invention. FIG. 2 is a cross sectional view representing the interior of the first embodiment according to the present invention. FIG. 2 is a cross sectional view of the connection point taken along a line 101 in FIG. 1b.

The following describes the structure of the connection point.

Reference numerals 1a and 1b denote superconducting lines to be connected.

The superconducting lines 1a and 1b are multi-filament superconducting lines where niobium titanium (NbTi) is used as a superconducting material and anoxic copper is employed as a stabilizer. An NbTi superconducting line was used in the present embodiment, but other superconducting lines may be used. The stabilizer was removed from superconducting lines 1a and 1b, and superconducting filaments 4a and 4b are exposed inside the connection point. In the present embodiment, the stabilizer was completely eliminated, but part of the stabilizer may be left unremoved if the superconducting filament is brittle.

The coating material 3 of the connection point is arranged in a hollow structure of anoxic copper. The space between superconducting filaments 4a and 4b and the coating material 3 of the connection point is filled with $MgB_2$ powder 2.

The following describes how to produce the connection point: From the tip of two superconducting lines to be connected, the stabilizer of anoxic copper is removed by chemical treatment. In the present embodiment, nitric acid is used to remove the stabilizer, but it can be scraped off by mechanical means. The length of the stabilizer removed was about 30 mm in the present embodiment. Two superconducting lines are the same, with a diameter of 0.7 mm and a critical current of 800 A in the external magnetic field of 0 T. The superconducting line with stabilizer removed is inserted into a 60 mm long pipe made of anoxic copper having an inner diameter of 5 mm and an outer diameter of 10 mm. The anoxic copper pipe is used as a coating material of the connection point in the final stage. The dimensions of the superconducting line, anoxic copper pipe and the like are determined to conform to the dimensions and characteristics of the superconducting line to be connected as well as the environment where the connection point is arranged. If they are changed, the dimensions must also be changed. When the superconducting lines are inserted into the anoxic copper pipe, the superconducting filaments is almost parallel and is preferably placed as close as possible to each other. After the end of the pipe on the side where two superconducting lines are inserted is crimped by a press, the anoxic copper pipe is filled with $MgB_2$ powder through the other end. In this case, an appropriate amount of powder should be filled by giving consideration to the density and volume in the final stage, $MgB_2$ powder used in the present embodiment has an average particle size of 20 microns or less. After $MgB_2$ powder has been filled, the uncrimped end of the pipe is also crimped by the pressed similarly to the case of the other end. Then the still uncrimped portion of the pipe, namely, the central portion of the pipe is crimped is crimped by the press so that the pipe has a rectangular section. A press was used in the present embodiment, but any apparatus will do so long as the connection point can be mechanically compressed. Further, other configuration instead of a rectangular section can be used. The section of the connection point crimped by the press is about 10 mm wide and about 6 mm thick. The position of $MgB_2$ powder in the section of the connection point is about 8 mm wide and 2 mm thick. Needless to say, these dimensions depend on the dimensions of the superconducting line and pipe as well as the amount of $MgB_2$ powder.

FIG. 3 shows the current/voltage characteristics in liquid helium regarding the external magnetic field of the superconducting line connection produced in the aforementioned manner. Current flows between two superconducting lines, and voltage is the value between two points 10 mm away from the coating material of the connection point in each superconducting line. As shown in FIG. 3, generation of voltage was not observed up to 450 A, and a superconducting state was confirmed below 450 A. Further, other superconducting lines were also used to confirm the presence of superconducting state. Critical current measuring conditions mentioned above will be used in the following description unless otherwise specified.

As described above, it has been made clear that $MgB_2$ powder enables electric connection of two superconducting lines in the superconducting state.

To improve current conduction, the present inventors studied (1) dependency on $MgB_2$ powder particle size of critical current at the connection point, (2) the coating material of connection point, (3) metal to be added to $MgB_2$ powder and the amount thereof, (4) presence or absence of heat treatment and (5) density of $MgB_2$ powder. They manufactured a connection point and evaluated it.

The following describes the embodiments from 2 to 7:

Embodiment 2

$MgB_2$ powder with varying average particle sizes was prepared in advance, and a connection point was manufactured in the same method as Embodiment 1. The average particle size was measured by a scanning electron microscope, and the particle size of 95% or more powder was confirmed to be within 20% of the average particle size. $MgB_2$ powder is compressed to the density equivalent to 80%±5% of the theoretical density. Table 1 shows the relationship between the result of measuring the critical current of the connection produced in this way and the average particle size. Unless otherwise specified, it is assumed that anoxic copper is used for the coating material of the connection point, and the NbTi line described in Embodiment 1 is used for the superconducting line.

TABLE 1

| Average particle size (μm) | 8 | 11 | 14 | 17 | 20 | 23 | 26 | 29 | 32 | 35 |
|---|---|---|---|---|---|---|---|---|---|---|
| Critical current (A) | 490 | 440 | 480 | 460 | 450 | 350 | 340 | 310 | 280 | 210 |

As shown in Table 1, when the average particle size is 20 microns or more, the critical current tends to increase as the particle size increases. If it is below 20 microns, however, there is considered to be no big change although there is a slight increase in the critical current. If it is 20 microns or more, the critical current is found to decrease. This is because, if the particle size is increased, close adhesion between particles is deteriorated and the superconducting state cannot be maintained on the powder particle boundary. Another possible reason is that close adhesion between the filament of the superconducting line and $MgB_2$ powder is deteriorated. On the other hand, when the particle size does not exceed 20 microns, there is only a slight increase of critical current. This is because there is an increase in the particle boundary on the portion where current flows although there is an excellent close adhesion between powder particles and between powder particles and superconducting filaments. This is considered to have caused the rate of critical current increase to be reduced. As described above, it has been confirmed that critical current can be increased when the average particle size of $MgB_2$ powder is 20 microns or less.

Embodiment 3

Using the pipe made of gold, silver, copper, platinum, palladium, aluminum, niobium, lead, tin, magnesium, indium, tungsten, cobalt, nickel, iron, tantalum or chromium, the present inventors produced connection points according to the method as in Embodiment 1. It has been revealed that connection in the superconducting state is possible for all types. Especially copper, gold, silver and aluminum have excellent spreading property; therefore, when the pipe was crimped, excellent correction structure was obtained without any crack on the surface. Connection points were produced using the pipes made of SUS304 stainless steel, copper/nickel alloy, silver/magnesium alloy and the like, and it has been revealed that connection in the superconducting state is possible.

Embodiment 4

A given amount of indium powder having an average particle size 5 microns was added to $MgB_2$ powder having an average particle size of 20 microns to produce connection points according to the method as in Embodiment 1. The result of measuring the critical current is shown in Table 2. Crimping was conducted at a surface pressure of 2 ton/cm$^2$ in the final crimping operation. The percentage of addition in Table 2 denotes percentage by mass.

TABLE 2

| Percentage of added indium powder (%) | 0 | 0.01 | 0.1 | 1 | 10 | 25 | 40 | 50 | 60 | 70 | 75 |
|---|---|---|---|---|---|---|---|---|---|---|---|
| Critical current (A) | 450 | 420 | 440 | 490 | 510 | 600 | 420 | 300 | 120 | 10 | 0 |

As shown in Table 2, critical current has been confirmed to increase as the percentage of added indium powder is increased from zero. If the percentage reaches 25% or more, critical current is found to decrease. When the percentage of addition does not exceed about 50%, a connection point can be used sufficiently. When 25% of indium powder was added, the cross section of the connection point was observed by a scanning electron microscope. Indium was not present over the entire boundary although indium is present on some portion of the boundary of $MgB_2$ powder particle. A greater portion was occupied by the bonded surface of $MgB_2$ powder particles. On the other hand, in case of the cross section of the connection point where 75% was added, almost entire surface of Mg $B_2$powder particles was covered by indium. In each case, there was no big change in the average size and configuration of $MgB_2$ powder particles. It can be estimated from these observations that soft indium powder was crushed among hard $MgB_2$ powder particles when crimped by a press and was arranged in the clearances among $MgB_2$ powder particles. Therefore, bondage among $MgB_2$ powder particles was mechanically stable and $MgB_2$ powder particles were bonded with one another, with the result that critical current was increased. However, as the percentage of addition was further increased, there was an increase increased in the mount of indium among $MgB_2$ powder particles. As the percentage was raised up to 75%, the space among $MgB_2$ powder particles was completely filled with indium, and there was no contact surface among $MgB_2$ powder particles. Thus, electric resistance of indium occurred all over, and the superconducting state did not occur as a whole. The present inventors used metal powder of lead and lead/tin alloy as an additive other than indium, and made similar studies. It has been revealed that critical current was higher when added than when not added. Likewise, when the percentage of addition was increased over some level, critical current was reduced. Thus, it has been revealed that addition of metal powder improves critical current.

Embodiment 5

As in the case with Embodiment 4, connection points were produced by adding indium powder to $MgB_2$ powder. In this case, however, the final crimping step in Embodiment 1 was carried out by heating up to more than 157 degrees Celsius which is the melding point of indium. Table 3 shows the dependency of the critical current on the percentage of added indium powder in this case. Added indium powder had an average particle size of 5 microns, the same size as above. The surface pressure in the final crimping step by a press was 2 ton/cm$^2$, the same pressure as above.

TABLE 3

| Percentage of added indium powder (%) | 0 | 0.01 | 0.1 | 1 | 10 | 25 | 40 | 50 | 60 | 70 | 75 |
|---|---|---|---|---|---|---|---|---|---|---|---|
| Critical current (A) | 450 | 480 | 550 | 670 | 690 | 650 | 430 | 310 | 100 | 20 | 0 |

Comparison between Tables 3 and 2 reveals that there is an increase in critical current on the whole. Further, it has been revealed that a bigger increase in critical current results from smaller percentage of addition. The cross section of the connection point was observed by a scanning electron microscope. It has been shown that a higher density of $MgB_2$ powder particles a greater thickness of indium on the surface of $MgB_2$ powder particles result from a smaller percentage of added powder. On the other hand, when the percentage of addition is 25% or more, the thickness of indium among $MgB_2$ powder particles was increased, and bondage among $MgB_2$ powder particles was poor, according to the observation by the present inventors. Thus, it has been revealed that, when indium among $MgB_2$ powder particles were molten by heating beyond the melting point of indium, critical current can be increased by reducing the amount of indium to be added, as compared to the case where it is not heated. Further, the present inventors used metal powder of lead and lead/tin alloy as an additive other than indium, and made similar studies. It has been revealed that critical current was higher when added than when not added. These considerations have lead them to conclude that, when a given metal or alloy is added, heating beyond the melting point is effective in improving critical current.

Embodiment 6

The present inventors produced connection points where the density of $MgB_2$ was changed by changing surface pressure in the final crimping stage, and each critical current was measured. The production method is the same as that described in Embodiment 1. Several connection points were manufactured, wherein the volumes of the $MgB_2$ portions in connection points were kept unchanged. The average particle size of the $MgB_2$ powder is 20 microns. Table 4 shows the result of measuring the critical current. Density in the Table indicates the ratio between the density of $MgB_2$ in actually manufactured connection points and the theoretical density.

TABLE 4

| Density ratio (%) | 30 | 40 | 50 | 60 | 70 | 80 | 90 |
|---|---|---|---|---|---|---|---|
| Critical current (A) | 5 | 10 | 450 | 470 | 560 | 660 | 700 |

As shown in Table 4, an abrupt reduction of critical current is observed when $MgB_2$ is 50% or less. This is considered to be caused by an increase in the spacing among $MgB_2$ powder particles, with the result that bondage can be hardly carried out in the superconducting state. The result of measurement has led to the conclusion that the density of $MgB_2$ must be 50% or more of the theoretical density.

Embodiment 7

Figure 4C:
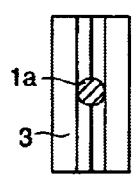
Figure 4A:
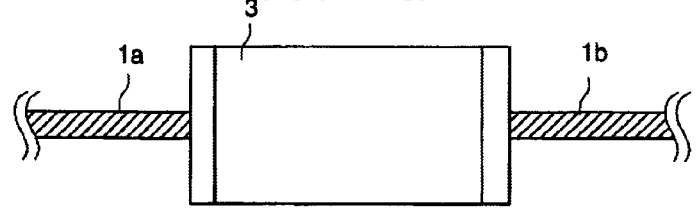
FIG. 4a is a front view of a superconducting line with a connection part thereof representing embodiment 7.
Figure 4B:
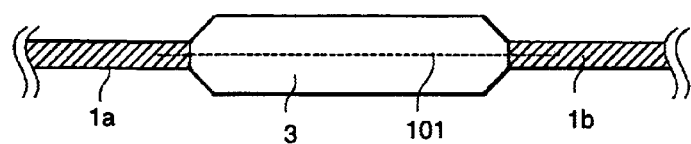

FIGS. 4a to 4c each are an external view representing the seventh embodiment of a superconducting line connection point (hereinafter referred to as "connection point") according to he present invention. FIGS. 5a and 5b are internal views of the seventh embodiment according to the present invention. FIG. 5a is a cross sectional view representing a connection point, taken along a line 101 in FIG. 4b, FIG. 5b is a horizontal cross sectional view of FIG. 5a, and FIG. 5c is a side view of FIG. 5a.

The following describes the structure of the connection point:

Reference numerals 1a and 1b denote superconducting line to be connected. Any superconducting line can be used, but in the present embodiment, superconducting lines 1a and 1b are multi-filament superconducting lines wherein the Bi-2212 is used as a superconducting material and silver is employed as a sheath material. The tip of each of two superconducting lines is cut at an oblique angle, and the angle between the cross section and the centerline of the superconducting line is 30 deg. or less in the present embodiment. The angle of the cross section must be determined with consideration given to the strength of the superconducting line and the like. In principle, the angle can be within the entire range from 90 to 180 degrees exclusive. In the cross section, the superconducting filament of the superconducting line is exposed to the outside. Two superconducting lines are arranged in such a way that the cross sections face each other. In the present embodiment, the cross sections of superconducting lines face each other, but other arrangements can also be used if the filament and $MgB_2$ powder are in contact with each other. Further, if electric resistance is assumed to occur to the connection point, the arrangement which allows current to pass through such a structure as sheath material or separately inserted metal may be used, wherein the filament and $MgB_2$ powder are not in direct contact. The coating material 3 of the connection point is a hollow structure made of anoxic copper, and the space between the superconducting filaments 4a and 4b and coating material 3 of the connection point is filled with $MgB_2$ powder 2.

The following describes how to manufacture the connection point: The tips of the two superconducting lines to be connected are each cut at an oblique angle, and the angle between the cross section and the centerline of the superconducting line should preferably be an acute angle of 30 deg. or less. In the present embodiment, this angle is about 20 deg. It should be noted that the superconducting line to be connected may have any cross section. In the present embodiment, the cross section is a circle having a diameter of 1.0 mm. The superconducting line used is the oxide superconducting line with a critical current of 700 A in the external magnetic field of 0 T. The superconducting line is inserted into the anoxic copper pipe having a length of 60 mm, inner diameter of 5 mm and outer diameter of 10 mm. This anoxic copper pipe serves as a coating material of the connection point. Then a press is used to crimp the end of the pipe where the superconducting line is inserted. After that, the pipe is filled with $MgB_2$ powder through the other end. $MgB_2$ powder used in the present embodiment has an average particle size of 20 microns. After the other superconducting line has been inserted, the still uncrimped end of the pipe is crimped. Then a press is used to crimp the still uncrimped portion to form the cross section of the pipe in a rectangular shape. In this case, the cross section of the connection point is bout 10 mm wide and about 6 mm thick. Further, the portion of $MgB_2$ powder in the cross section of the connection point is about 8 mm wide and about 2 mm thick. As described above, the tips of the two superconducting lines to be connected are each cut at an oblique angle, and the angle between the cross section and the centerline of the superconducting line is an acute angle of 30 deg. or less. In the cross section, the superconducting filament of the superconducting line is exposed to the outside. $MgB_2$ powder is located between cross sections of the superconducting lines and around the superconducting lines. The coating material of the metal-made connection point is placed further outside thereof. This structure provides the following advantages:

(1) The angle between the cross section and superconducting line centerline is an acute angle of 30 degrees. Compared to the case of 90 degrees, there is an increase in the area of contact between the superconducting filament and $MgB_2$ powder, and critical current can be improved.

(2) Especially in the oxide superconducting line the superconducting filament is made of brittle ceramic, so it is difficult to expose the superconducting filament as a single body to the outside by removing the stabilizer. However, a greater area of the superconducting filament can be exposed to the outside without removing the stabilizer by forming the tip of the superconducting line in an oblique shape. This makes it possible to improve the critical current.

(3) By forming the tip of the superconducting line in an oblique shape, close adhesion between the superconducting filament and $MgB_2$ powder is improved when crimping the coating material of the connection point in the direction at a right angle to the superconducting line. This allows critical current to be increased.

Table 5 shows the result of measuring the critical current by changing the external magnetic field in the connection point produced according to the above-mentioned procedure.

TABLE 5

| External magnetic field | 0 | 0.1 | 0.2 | 0.5 | 1 | 2 | 5 |
|---|---|---|---|---|---|---|---|
| Critical current (A) | 700 | 550 | 400 | 350 | 330 | 310 | 290 |

As shown in Table 5, critical current is reduced as the external magnetic field increases. However, it has been revealed that this critical current has about the same value as the original critical current of the superconducting line to be connected. It has been revealed, in other words, that critical current at the portion of $MgB_2$ powder is greater that the critical current of the superconducting line, and the connection structure is excellent.

Embodiment 8

The following describes the superconducting magnet system wherein the connection point of the superconducting line explained in the Embodiment 1 is applied to connection between the superconducting magnets of a multi-layer structure. FIG. 6 shows the conceptual drawing. The superconducting coil in the present embodiment comprises the first layer superconducting coil 21, the second layer superconducting coil 22 and the third layer superconducting coil 23. All coils are the solenoid coils using the NbTi multi-filament superconducting line. The used superconducting line has a diameter of 0.7 mm, and a critical current of 800 A at an external magnetic field of 0 T. Needless to say, the type of superconductor of the superconducting coil, the structure and dimensions of the superconducting line and the structure and dimensions of the superconducting coil need not be the same as those of the present embodiment.

Table 6 shows the specifications of the coil in the present embodiment.

TABLE 6

| External magnetic field | 1st layer | 2nd layer | 3rd layer |
|---|---|---|---|
| Inner diameter (mm) | 600 | 120 | 180 |
| Outer diameter (mm) | 100 | 160 | 220 |
| Shaft length (mm) | 100 | 100 | 100 |
| Rated current (A) | | 158 | |
| Rated center magnetic field (T) | | 8.0 | |
| Maximum empirical magnetic field (T) | 8.4 | 5.2 | 3.1 |

These coils with coil centers aligned are arranged on the same shaft. Lead outside the first layer coil 28b and lead inside the second layer coil 28c are electrically connected through the superconducting line/superconducting line connection point 27a, and lead outside the second layer coil 28d and lead inside the third layer coil 28e are electrically connected through superconducting line/superconducting line connection point 27b. The lead inside the first layer coil 28a and bus bar 25a are connected through the bus bar/superconducting line connection point 26a, and lead outside the third layer coil 28f and bus bar 25b are connected through the bus bar/superconducting line connection point 26b. In the present embodiment, connection between the bus bar and coil lead is made by soldering, but welding, mechanical contact or other method may be used. Bus bars 25a and 25b are connected with gas cooled type current leads 24a and 24b, respectively. The gas cooled type current lead is configured in such a way that a bundle of copper wires are inserted into a copper pipe. Evaporation gas of liquid helium 30 flowing out from inside the cryostat through the clearance between copper wires, thereby reducing Joule heat generation and thermal intrusion and minimizing evaporation of liquid helium. The gas cooled current lead can be connected with the power supply for excitation outside the cryostat, and the superconducting coil can be excited by the power supply for excitation. The rated magnetic field of this superconducting magnet system at the center is 8.0 T when a current of 158 A is supplied. The maximum empirical magnetic field is 8.4 T, 5.2 T and 3.1 T for the first, second and third layer coils, respectively.

A superconducting line connection point having a structure shown in FIG. 2 is used as the superconducting line/superconducting line connection point in this magnet system. The average particle size of $MgB_2$ powder used for connection is 20 microns, and indium powder having an average particle size of 5 microns is added to $MgB_2$ powder at the ratio of 25% in terms of mass ratio. The material of the coating material of the connection point is made of copper, and the mixture between $MgB_2$ powder and indium powder is compressed to the density equivalent to 80% or more of theoretical density. The superconducting line has stabilizer removed by chemical treatment, and the superconducting filament is exposed to the outside. The length of the stabilizer removed is about 30 mm. The superconducting line/superconducting line connection points at two positions are located where a leakage magnetic field of 2 to 3 T is applied during application of when rated current.

When this magnet system was subjected to excitation, quenching occurred at 168 A. Magnetic field at the center was 8.5 T at this time. The present inventors studied the status of voltage generation on each part of the coil to find out that voltage occurred from the first layer coil in quenching. Occurrence of voltage was not observed at the superconducting line/superconducting line connection point.

The present inventors changed the superconducting line/superconducting line connection points into those produced according to soldered connection method. Excitation test was conducted to find out that generation of voltage started on the superconducting line/superconducting line connection points connecting the first layer coil and the second layer coil immediately after start of current application, and quenching occurred to the coil at an applied current of 620 A. Judging from the trend of generated voltage having been measured, it is apparent that Joule heat generation occurred as a result of increased current in the superconducting line/superconducting line connection point having changed to the non-superconducting state due to leaked magnetic field, and the non-superconducting area expanded to the superconducting line area, with the result that the entire coil was quenched.

The result of the above test has make it clear that high-performance, high-stability connection of the superconducting line can be ensured by using $MgB_2$ powder for the superconducting line/superconducting line connection point.

Embodiment 9

Figure 7:
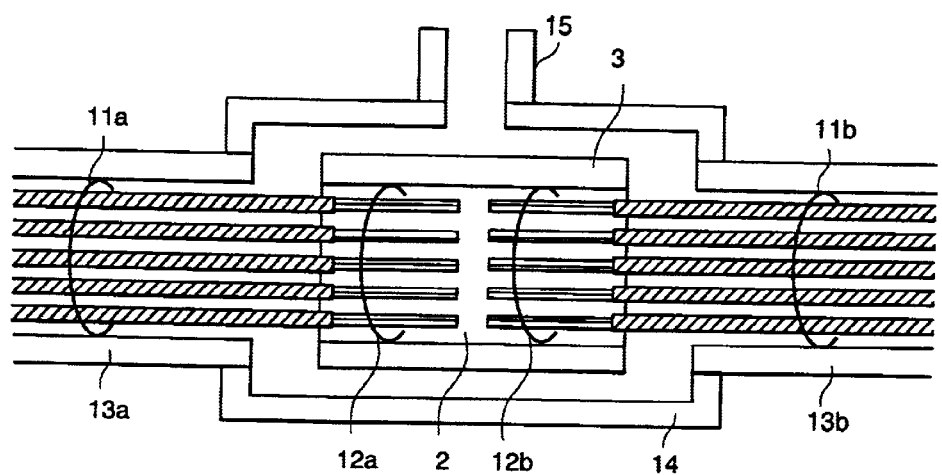
FIG. 7 is a cross section representing embodiment 9.

FIG. 7 is a cross sectional view representing the ninth embodiment of the superconducting line connection point (hereinafter referred to as "connection point") according to the present invention. Reference numerals 11a and 11b denote superconducting stranded wires inside the cable-in-conduit type forcibly cooled superconductors (hereinafter referred to as "superconductors"). The forcibly cooled superconductor in the present embodiment is a cable-in conduit type superconductor consisting of stranded wires arranged inside the stainless steel-made conduits 13a and 13b of cylindrical form, wherein the aforementioned stranded wires are formed by bundling and twisting multiple multi-filament superconducting lines where the NbTi is used as a superconducting material and copper as a stabilizer. NbTi was adopted as a superconducting material in this embodiment, but other superconductors can also be adopted, as confirmed by the experiment conducted by the present inventors. Further, aluminum, silver, copper/nickel alloy or composite material thereof in addition to copper can also be used as a stabilizer. Reference numerals 12a and 12b denote superconducting filaments inside the aforementioned stranded wires, and the superconducting filament is exposed to the outside by removing the stabilizer of the superconducting line end portion by chemical treatment. The stabilizer can be removed by mechanical cutting method in addition to chemical treatment. Reference numerals 13a and 13b denote superconductor conduits, which are cylindrical pipes made of SUS304L stainless steel. In addition to stainless steel, Incoloy or other alloys as well as other metal materials can also be used as a material. Further, the cross section can be formed in any configuration including a rectangular shape. The percentage of the superconducting stranded wire inside the conduit in terms of volume is 60% or more. The exposed superconducting filament together with $MgB_2$ powder is accommodated in the coating material 3 of the connection point. They are crimped together with the coating material of the connection point, and the density of $MgB_2$ powder is reduced to 50% or more of the theoretical density by compression. The sleeve 14 is SUS304L-made pipe, and is arranged outside the coating material of the connection point. It is connected with both conduits by welding, and the superconducting line, the coating material of the connection point and $MgB_2$ powder are enclosed therein, except for a refrigerant discharge port 15 as an opening. The forcibly cooled superconductor in the present embodiment forms part of the superconducting coil. FIG. 7 shows superconducting coils arranged on the right and left.

A refrigerant used in this embodiment is super-critical pressure helium. If there is no problem of pressure loss or the like, it is also possible to use liquid, gas or supercritical pressure body of helium, neon, hydrogen, nitrogen or mixture thereof, so long as the temperature of such a substance can be kept below the critical temperature of the applied superconducting material. Super-critical pressure helium flows from the end portions of the superconducting coils on the right and left into the superconductor. After cooling the entire superconducting coil, it passes through the space between the coating material of the connection point and sleeve at the connection point and is discharged from the refrigerant discharge port.

Figure 8:
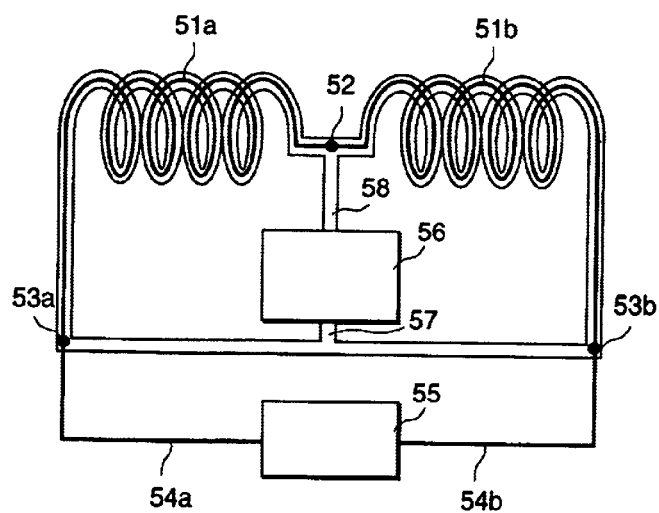
FIG. 8 is a conceptual view representing a forcibly cooled superconductor coil in embodiment 9.

FIG. 8 is a schematic diagram representing the forcibly cooled superconducting coil where superconducting connection point according to the present embodiment is applied. Reference numerals 51a and 51b are superconducting coils using cable-in-conduit type forcibly cooled superconductor. This coil is produced for connection test, and uses a cable-in conduit type superconductor where thirty-six NbTi superconducting lines having a diameter of 0.9 mm are accommodated into a conduit with an inner diameter of 7 mm. It is a ten-turn solenoid coil having a diameter of 200 mm. The coil constant is as small as 0.00001 or less, but the critical current of the superconductor is as great as 3600 A in the external magnetic field of 5 T. Numeral 52 denotes a connection point, and the cross section of the $MgB_2$ powder enclosed in the coating material of the connection point in this position is about three times that of the superconducting stranded wire. The density of $MgB_2$ powder portion is reduced to 60% of the theoretical density by compression. Numerals 54a and 54b denote bus bars for current supply, and the 53a and 53b denote a connection point between a superconducting coil and bus bar. Current is applied in series to two superconducting coils from the coil excitation power supply 55 via the bus bar through the connection point between the superconducting coil and bus bar. On the other hand, super-critical pressure helium is generated by a super-critical pressure helium generating apparatus 56, and is separated into two streams at a discharge port 57 to be supplied in parallel to the superconducting coil. Then it returns from the connection point to the super-critical pressure helium generating apparatus of a suction port 58 of the super-critical pressure helium generating apparatus according to a circulation system. The superconducting coil in the present embodiment is a test coil, so only a very small magnetic field is generated. Needless to say, it is possible to configure a superconducting coil with increased magnetic field by increasing the number of turns. Such a superconducting coil may cause the number of connection points to be increased, but this configuration is possible because the current application route and refrigerant circulation route which may function as a superconducting coil are the same. Further, the present embodiment is configured to allow circulation of super-critical pressure helium. It is also possible to use the configuration wherein a refrigerant stored in a tank or the like is discharged into the atmosphere outside the superconducting coil after having cooled the superconducting coil.

The present inventors conducted an excitation test using this superconducting coil arranged inside another outer layer superconducting magnet which can produce 5 T magnetic field. This is because an external magnetic field was essential for evaluation of the superconducting coil since a test coil was used in the present embodiment and the maximum empirical magnetic field was small. Needless to say, if a large-sized coil is used, magnetic field generated by the superconducting coil itself is applied. Use of the maximum empirical magnetic field of the coil itself is preferred for evaluation. The connection point is located slightly away from the coil, and magnetic field of 5 T is applied thereto. Further, supercritical pressure helium has a pressure of about $10^6$ Pa, a temperature of about 5K and a flow rate of about 5 g/s. Under these conditions, current could be applied up to 3600 A which was a base angle of the superconductor. Then current was increased beyond 3600 A, and quenching occurred to the superconducting coil although it did not take place at the connection point. Thus, the connection point in the present embodiment has a critical current value of 3600 A or more at the external magnetic field of 5 T. This was found to provide a high performance in excess of the critical current value. Further, when the flow rate of super-critical pressure helium was halved to about 2.5 g/s, quenching did not occur at the connection point, and it has been revealed that there is stability in changes of the flow rate of refrigerant at the connection point, although the critical current of the coil fell down to 2800 A.

The present invention reduces power consumption due to a low electric resistance even if the superconducting line connection point is arranged in the magnetic field, thereby simplifying the structure of the connection point.

What is claimed is:

1. A superconducting line connection structure for connecting two or more superconducting lines, wherein the superconducting line connection structure comprises superconductor powder comprising magnesium diboride present between said superconducting lines, and wherein a superconducting filament enclosed in each said superconducting line is directly in contact with said superconducting powder at least on some portion of the contact surface between said superconducting line and said superconducting powder.

2. A superconducting line connection structure according to claim 1, further comprising a metal powder or an alloy powder in a mixture with the superconducting powder between said superconducting lines.

3. A superconducting line structure according to claim 2, wherein the metal powder or alloy powder has a melting point lower than the superconducting powder.

4. A superconducting line connection structure according to claim 2, wherein said superconducting lines and the mixture of superconducting powder and metal powder or alloy powder are enclosed in a coating material made of a pure metal of gold, silver, copper, platinum, palladium, aluminum, niobium, lead, tin, magnesium, indium, tungsten, cobalt, nickel, iron, tantalum or chromium, or an alloy containing at least one of said metals.

5. A superconducting line connection structure according to claim 1, wherein the average particle size of said superconducting powder is 20 microns or less.

6. A superconducting line connection structure according to claim 1, wherein said superconducting lines and said superconducting powder are enclosed in a coating material made of a pure metal of gold, silver, copper, platinum, palladium, aluminum, niobium, lead, tin, magnesium, indium, tungsten, cobalt, nickel, iron, tantalum or chromium, or an alloy containing at least one of said metals.

7. A superconducting line connection structure according to claim 1, wherein the density of said superconducting powder is 50% or more of theoretical density.

8. A superconducting magnet apparatus comprising a superconducting line connection structure according to claim 1.

9. A superconducting line comprising a superconducting line connection structure according to claim 1.

10. A superconducting line connection structure for connecting two or more superconducting lines, wherein the superconducting line connection structure comprises superconductor powder comprising magnesium diboride present between the superconducting lines, and wherein the each superconducting line to be connected is a superconducting stranded wire formed by twisting multiple superconducting lines.

11. A superconducting line connection structure according to claim 10, characterized in that said superconducting stranded wire is a superconducting stranded wire inside a cable-in-conduit type forcibly cooled superconductor.

12. A superconducting magnet apparatus comprising a superconducting line connection structure manufactured by intervening superconducting powder comprising magnesium diboride between at least two superconducting lines, wherein heat treatment of said electrical connection structure is not conducted.

* * * * *